(12) United States Patent
Lai

(10) Patent No.: US 8,009,399 B2
(45) Date of Patent: Aug. 30, 2011

(54) ESD IMPROVEMENT WITH DYNAMIC SUBSTRATE RESISTANCE

(75) Inventor: Da-Wei Lai, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 12 days.

(21) Appl. No.: 12/548,586

(22) Filed: Aug. 27, 2009

(65) Prior Publication Data

US 2011/0051298 A1 Mar. 3, 2011

(51) Int. Cl.
*H02H 9/00* (2006.01)
*H02H 7/12* (2006.01)
*H02H 1/00* (2006.01)
*H02H 1/04* (2006.01)
*H02H 3/22* (2006.01)

(52) U.S. Cl. .......................................... 361/56; 361/118

(58) Field of Classification Search .................... 361/56
See application file for complete search history.

(56) References Cited

U.S. PATENT DOCUMENTS

| | | | |
|---|---|---|---|
| 6,424,510 B1 * | 7/2002 | Ajit et al. ........................ | 361/59 |
| 6,465,768 B1 | 10/2002 | Ker | |
| 6,566,715 B1 * | 5/2003 | Ker et al. ....................... | 257/355 |
| 2010/0128401 A1 * | 5/2010 | Lai et al. ........................ | 361/56 |

* cited by examiner

*Primary Examiner* — Dharti Patel
(74) *Attorney, Agent, or Firm* — Duane Morris LLP

(57) ABSTRACT

In some embodiments, an electrostatic discharge (ESD) protection circuit includes a substrate resistance control circuit coupled to a body of a first NMOS transistor. The substrate resistance control circuit increases a resistance of the body of the first NMOS transistor during an ESD event. The first NMOS transistor has a drain coupled to an input/output (I/O) pad and a gate coupled to a first voltage source. The first voltage source is set at ground potential.

19 Claims, 2 Drawing Sheets

ESD IMPROVEMENT WITH DYNAMIC SUBSTRATE RESISTANCE

FIELD OF DISCLOSURE

The disclosed systems and methods relate to integrated circuits. More specifically, the disclosed systems and methods relate to integrated circuits with improved electrostatic discharge (ESD) protection circuits.

BACKGROUND

With the continued miniaturization of integrated circuit (IC) devices, the current trend is to produce integrated circuits having shallower junction depths, thinner gate oxides, lightly-doped drain (LDD) structures, shallow trench isolation (STI) structures, and self-aligned silicide (salicide) processes, all of which are used in advanced sub-quarter-micron complementary metal oxide semiconductor (CMOS) technologies. All of these processes cause the related CMOS IC products to become more susceptible to damage due to ESD events. Therefore, ESD protection circuits are built onto the chip to protect the devices and circuits on the IC from ESD damage.

FIG. 1A illustrates a conventional ESD protection circuit 100, and FIGS. 1B and 1D illustrate a plan view and a cross-sectional view of the GGNMOS 106 illustrated in FIG. 1A. As shown in FIG. 1A, the ESD protection circuit 100 includes control circuitry 102 connected to the gate of an output driver 104 and a gate-grounded NMOS transistor (GGNMOS) 106 serving as an ESD protection device. The trigger voltage, Vt1, of the output driver 104 is usually lower than the trigger voltage of the GGNMOS protection device 106 during an ESD event due to the gate of the output driver 106 being at an unknown state during the ESD event. The ESD event may damage the circuitry coupled to the output driver 104 as the voltage across the output driver 104 will be triggered before the GGNMOS 106 is triggered due to the higher trigger voltage of the GGNMOS 106.

One prior art attempt to reduce the trigger voltage of the GGNMOS 106' is illustrated in FIGS. 1C and 1E. As shown in FIG. 1C, the GGNMOS 106' includes a P+ implantation region in the P-well below the drain. The inclusion of the P+ implantation region reduces the trigger voltage of the GGNMOS 106' and provides enhanced protection from ESD events. However, the additional protection comes at an additional process cost for the P+ implantation.

U.S. Pat. No. 6,465,768 issued to Ker et al. discloses a substrate biasing circuit for providing a higher substrate voltage during ESD events, which, for a given ESD current, enables the trigger voltage of the GGNMOS to be reduced. However, the circuit disclosed in Ker is designed for an RC time constant of 2 µs or greater to provide protection against ESD events and at the same time protect against false triggers during powering up. However, the size of the resistor and capacitor to achieve an RC time constant of approximately 2 µs or more must be quite large taking up valuable area on an integrated circuit.

Accordingly, an improved ESD protection circuit having a relatively small size is desirable.

SUMMARY

In some embodiments, an electrostatic discharge (ESD) protection circuit includes a substrate resistance control circuit coupled to a body of a first NMOS transistor. The substrate resistance control circuit increases a resistance of the body of the first NMOS transistor during an ESD event. The first NMOS transistor has a drain coupled to an input/output (I/O) pad and a gate coupled to a first voltage source. The first voltage source is set at ground potential.

In some embodiments, an electrostatic discharge (ESD) protection circuit includes a first NMOS transistor and a substrate resistance control circuit coupled to a body of the first NMOS transistor for increasing a resistance of the body of the first NMOS transistor during an ESD event. The first NMOS transistor has a gate coupled to ground through a first resistor, a drain coupled to a input/output (I/O) pad, and a source coupled to ground. The substrate resistance control circuit includes a second NMOS transistor and an RC circuit. The second NMOS transistor has a drain coupled to the body of the first NMOS transistor and a source coupled to a body of the second NMOS device and to ground. The RC circuit is coupled to a gate of the second NMOS transistor.

In some embodiments an electrostatic discharge (ESD) protection circuit includes a substrate resistance control circuit coupled to a body of a first NMOS transistor. The first NMOS transistor has a gate coupled to ground, a drain coupled to a input/output (I/O) pad, and a source coupled to ground. The substrate resistance control circuit increases a resistance of the body of the first NMOS transistor during an ESD event and includes a second NMOS transistor, a resistor, and a capacitor. The second NMOS transistor has a drain coupled to the body of the first NMOS transistor and a source coupled to a body of the second NMOS device and to ground. The first resistor is coupled to a first voltage source and to a first node. The first voltage source has a higher voltage potential than ground. The capacitor is coupled to the first node and to ground.

DETAILED DESCRIPTION

Figure 1A:
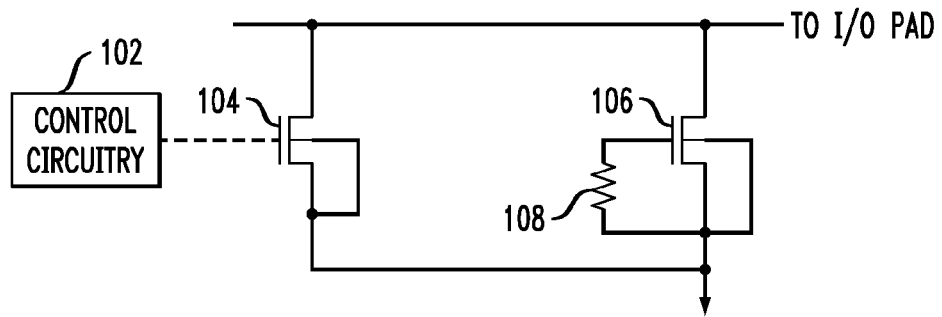
FIGS. 1A-1E illustrate various prior art ESD protection circuits.
Figure 1B:
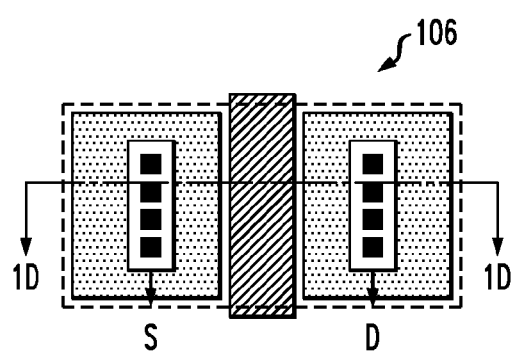
Figure 1C:
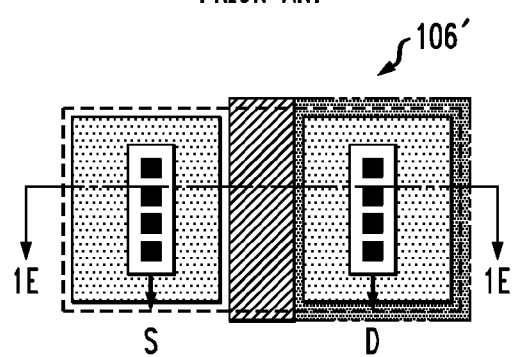
Figure 1D:
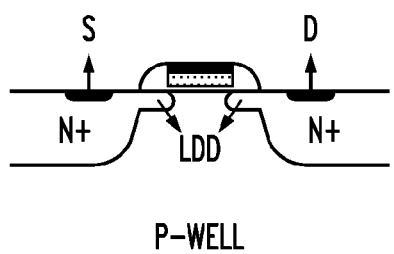
Figure 1E:
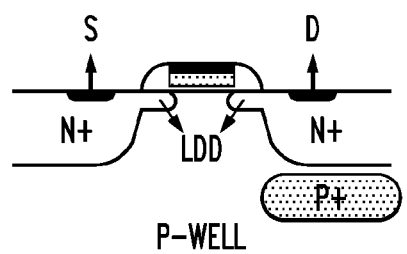
Figure 2:
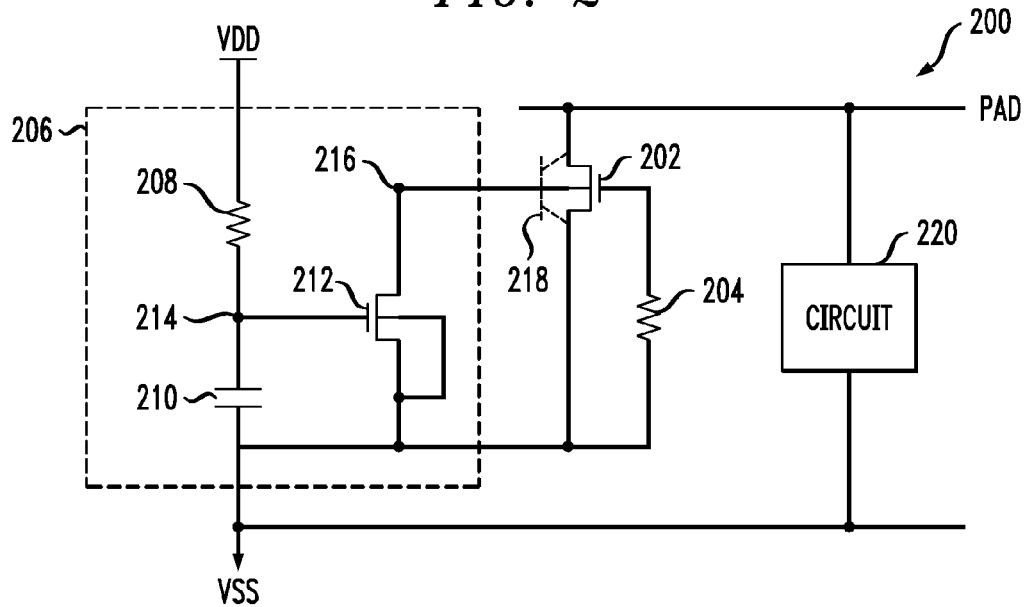
FIG. 2 is a schematic illustration of one example of an improved ESD protection circuit.

FIG. 2 illustrates one example of an improved ESD protection circuit 200. As shown in FIG. 2, the protection circuit 200 includes gate-grounded NMOS (GGNMOS) transistor 202 having a dynamic substrate resistance control circuit 206 coupled to its body. The dynamic substrate resistance control circuit 206 includes a resistor 208 coupled in series with a capacitor 210 at node 214. The dynamic substrate resistance control circuit 206 also includes an NMOS transistor 212 having its gate coupled to node 214, its source coupled to its body and low voltage source VSS, and its drain coupled to the body of the GGNMOS 202. The source of the GGNMOS 202 is coupled to the I/O pad, PAD, and the drain is coupled to VSS as is the gate of the GGNMOS 202 through an optional resistor 204. The drain and source of the GGNMOS 2020 form a parasitic lateral bipolar transistor 218 as illustrated in FIG. 2.

Resistor 204 may be added to reduce the trigger voltage of GGNMOS. In some embodiments, the resistor 204 may be a polysilicon (poly) resistor having a resistance of approximately 1 kΩ. One skilled in the art will understand that resistor 204 may have other resistances and be fabricated from other materials.

Resistor 208 and capacitor 210 of the substrate resistance control circuit 206 may be sized to provide an RC time constant between approximately 0.1 µs and 1 µs. For example, the resistor 208 may have a resistance between 100 kΩ and 1000 kΩ, and the capacitor may have a capacitance between 0.1 pF and 1 pF. The resistance and capacitance values of resistor 208 and capacitor 210 enable the sizes of each of enables the ESD protection circuit 200 to have a smaller footprint compared to conventional ESD protection circuits.

Figure 3:
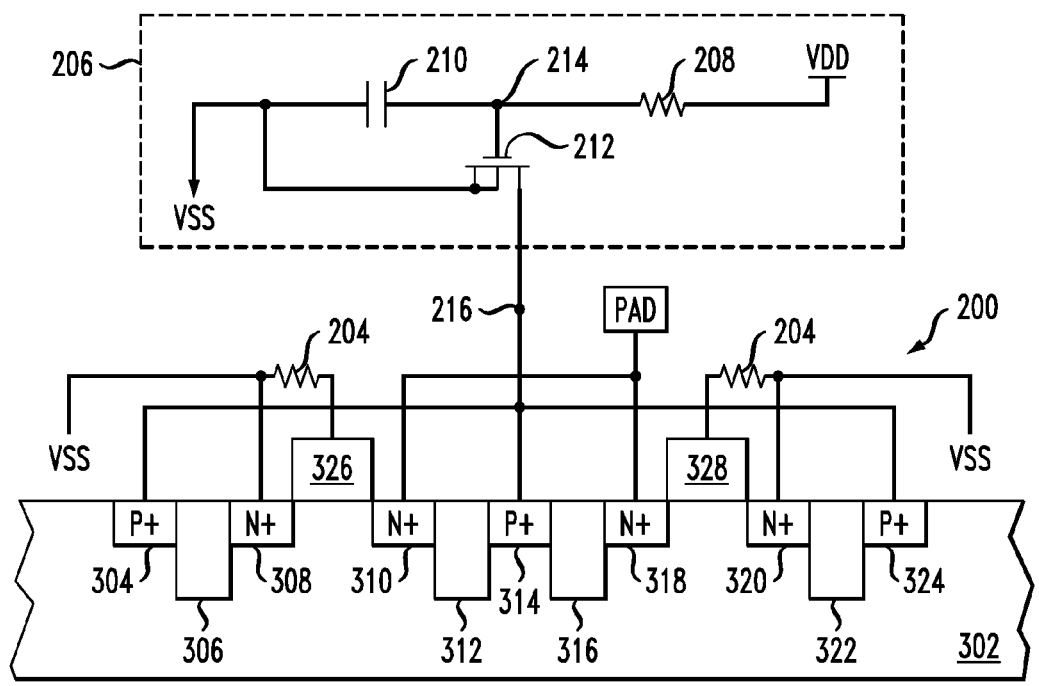
FIG. 3 is a cross-sectional view of the GGNMOS illustrated in FIG. 2.

FIG. 3 is a cross-sectional view of the ESD protection circuit 200. As illustrated in FIG. 3, the GGNMOS 202 is formed on a P-type substrate 302. A first shallow trench isolation (STI) structure 306 is formed between a first P+ diffusion region 304 and a first N+ diffusion region 308. The STI structure 306 may be formed from a dielectric material such as, for example, silicon dioxide. The P+ diffusion regions may be doped with a Group III material including, but not limited to, boron, gallium, aluminum, or the like. The N+ diffusion regions may be doped with a suitable N-type dopant such as arsenic, phosphorus, antimony, or other Group V element.

A second N+ diffusion region 310 is disposed adjacent to a second STI structure 312 as is a second P+ diffusion region 314. A third STI structure 316 is disposed adjacent to the second P+ diffusion region 314 and a third N+ diffusion region 318. A fourth STI structure 322 is disposed between a fourth N+ diffusion region 320 and a third P+ diffusion region 324. The drain of the NMOS 212 is coupled to each of the P+ regions 304, 314, and 324. The N+ diffusion regions 308 and 320 are coupled to VSS and to polysilicon gates 326 and 328 through resistors 204. N+ diffusion regions 310 and 318 are coupled to the PAD.

With reference to FIGS. 2 and 3, the operation of the improved ESD protection circuit 200 is now described. Under normal operation conditions, e.g., in the absence of an ESD event, node 214 will be at a voltage approximately equal to the voltage of VDD, and NMOS transistor 212 will be in the "on" state, e.g., current will be flowing from the source to the drain of NMOS transistor 212, and the body of GGNMOS 202 is effectively coupled to ground. Thus, the voltage at node 216 will be approximately equal to VSS or ground and the body of GGNMOS 202 will have a relatively small resistance.

During an ESD event in which the PAD is positively zapped, the ESD voltage pulse causes an avalanche breakdown of transistor 202 thereby conducting current away from the internal circuit 220. For example, when the PAD is zapped, the NMOS 212 will be switched "off" as its gate will be in a floating state and will effectively be at ground potential. With NMOS 212 off, little to no current flows from the source to the drain of NMOS 212 and its resistance, as well as the resistance of the body of the GGNMOS 202, approaches infinity. With the body of GGNMOS 202 having a resistance approaching infinity, a small substrate current is induced by through impact ionization due to the ESD event turns on the parasitic lateral bipolar transistor 218. For example, the voltage at node 216 ($V_{216}$) will exceed the threshold voltage of the parasitic lateral bipolar transistor 218 (e.g., 0.7 V) since $Vt1=V_{216}=1*R>0.7V$ and R approaches infinity. The turning on of the parasitic lateral bipolar transistor 218 causes an avalanche breakdown of GGNMOS 202 resulting in GGNMOS 202 turning on. With GGNMOS 202 on, current flows from the PAD to VSS through the GGNMOS 202 and is diverted the from the internal circuit 220. Accordingly, due to the higher substrate resistance and lower trigger voltage, the ESD protection circuit 200 provides ESD protection to internal circuit 220.

Advantageously, the ESD protection circuit 200 provides ESD protection without requiring additional processing such as P+ implantation. Additionally, the design of the ESD protection circuit 200 enables for smaller RC time constants compared to conventional ESD protection circuits reducing the size of the footprint of the ESD circuit on a substrate.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. An electrostatic discharge (ESD) protection circuit, comprising:
  a first NMOS transistor having a drain coupled to an input/output (I/O) pad and a gate coupled to a first voltage source, the first voltage source set at ground potential; and
  a substrate resistance control circuit coupled to a body of the first NMOS transistor, the substrate resistance control circuit including:
    a second NMOS transistor having a drain directly coupled to a first P+diffusion region of the first NMOS transistor, a gate coupled to an RC circuit, and a source coupled to the first voltage source, the substrate resistance control circuit for increasing a resistance of the body of the first NMOS transistor during an ESD event.

2. The ESD protection circuit of claim 1, wherein the RC circuit includes a resistor coupled in series with a capacitor with a first node connected therebetween, the gate of the second NMOS transistor coupled to the first node.

3. The ESD protection circuit of claim 2, wherein the capacitor is coupled to the first voltage source, and the resistor is coupled to a second voltage source, the second voltage source having a higher voltage potential than a voltage potential of the first voltage source.

4. The ESD protection circuit of claim 1, wherein a source of the first NMOS transistor is coupled to the first voltage source.

5. The ESD protection circuit of claim 1, wherein the gate of the first NMOS transistor is coupled to ground through a resistor.

6. The ESD protection circuit of claim 1, wherein the first P+diffusion region is separated from a first N+diffusion region by a first shallow trench isolation (STI) structure; and
  a second P+diffusion region is separated from a second N+diffusion region by a second STI structure, the second P+diffusion region directly coupled to the drain of the second NMOS transistor.

7. The ESD protection circuit of claim 6, wherein the first N+diffusion region is coupled to the first voltage source.

8. An electrostatic discharge (ESD) protection circuit, comprising:
  a first NMOS transistor having a gate coupled to ground through a first resistor, a drain coupled to a input/output (I/O) pad, and a source coupled to ground; and
  a substrate resistance control circuit coupled to a body of the first NMOS transistor for increasing a resistance of the body of the first NMOS transistor during an ESD event, the substrate resistance control circuit including:
    a second NMOS transistor having a drain directly coupled to first and second P+diffusion regions of the first NMOS transistor, a first N+diffusion region of the second NMOS transistor coupled to ground; and an RC circuit coupled to a gate of the second NMOS transistor.

9. The ESD protection circuit of claim 8, wherein the RC circuit includes a second resistor coupled in series with a capacitor.

10. The ESD protection circuit of claim 9, wherein the second resistor is coupled to a voltage source having a voltage potential greater than ground.

11. The ESD protection circuit of claim 9, wherein capacitor is coupled to ground.

12. The ESD protection circuit of claim 9, wherein the second resistor is coupled to the capacitor at a first node, and wherein the gate of the second NMOS transistor is coupled to the first node.

13. The ESD protection circuit of claim 8, wherein the first P+diffusion region is separated from the first N+diffusion region by a first shallow trench isolation (STI) structure; and the second P+diffusion region is separated from a second N+diffusion region by a second STI structure.

14. The ESD protection circuit of claim 13, wherein the first N+diffusion region is coupled to the first voltage source.

15. An electrostatic discharge (ESD) protection circuit, comprising:
a first NMOS transistor having a gate coupled to ground, a drain coupled to a input/output (I/O) pad, and a source coupled to ground; and
a substrate resistance control circuit coupled to a body of the first NMOS transistor for increasing a resistance of the body of the first NMOS transistor during an ESD event, the substrate resistance control circuit including:
a second NMOS transistor having a drain directly coupled to first and second P+diffusions regions of the first NMOS transistor, a source of the second NMOS transistor coupled to a body of the second NMOS transistor and to ground;
a first resistor coupled to a first voltage source and to a first node, the first voltage source having a higher voltage potential than ground, and
a capacitor coupled to the first node and to ground.

16. The ESD protection circuit of claim 15, wherein the gate of the first NMOS transistor is coupled to ground through a second resistor.

17. The ESD protection circuit of claim 15, wherein the first P+diffusion region is separated from a first N+diffusion region by a first shallow trench isolation (STI) structure; and the second P+diffusion region is separated from a second N+diffusion region by a second STI structure.

18. The ESD protection circuit of claim 17, wherein the first N+diffusion region is coupled to the first voltage source.

19. The ESD protection circuit of claim 15, wherein the resistor and capacitor have an RC time constant between approximately 0.1 µs and 1 µs.

* * * * *

UNITED STATES PATENT AND TRADEMARK OFFICE
CERTIFICATE OF CORRECTION

PATENT NO.        : 8,009,399 B2                              Page 1 of 1
APPLICATION NO.   : 12/548586
DATED             : August 30, 2011
INVENTOR(S)       : Da-Wei Lai It is certified that error appears in the above-identified patent and that said Letters Patent is hereby corrected as shown below:

Column 3, Line 59, replace "=1" with -- =|--

Signed and Sealed this
Thirteenth Day of December, 2011

David J. Kappos
*Director of the United States Patent and Trademark Office*